United States Patent [19]
Ohkawa et al.

[11] Patent Number: 5,798,560
[45] Date of Patent: Aug. 25, 1998

[54] SEMICONDUCTOR INTEGRATED CIRCUIT HAVING A SPARK KILLER DIODE

[75] Inventors: Shigeaki Ohkawa, Ashikaga; Toshiyuki Ohkoda, Ohra, both of Japan

[73] Assignee: Sanyo Electric Co., Ltd., Osaka, Japan

[21] Appl. No.: 742,184

[22] Filed: Oct. 30, 1996

[30] Foreign Application Priority Data

Oct. 31, 1995 [JP] Japan .................................. 7-284086

[51] Int. Cl.$^6$ .................................................. H01L 29/00
[52] U.S. Cl. ................................................ 257/555; 257/556
[58] Field of Search ............................ 257/565, 511, 257/512, 525, 569, 574, 577, 552, 555, 556

[56] References Cited

U.S. PATENT DOCUMENTS 3,327,182  6/1967  Kisinko ................................. 257/525

FOREIGN PATENT DOCUMENTS 6-104457  4/1994  Japan .
6-104458  4/1994  Japan .
6-104459  4/1994  Japan .

OTHER PUBLICATIONS

"Ring-shaped subcollector reach-through contact for vehicle PNP" IBM Technical Disclosure Bulletin; vol. 32, No. 6A Nov. 1989.

*Primary Examiner*—Wael Fahmy
*Attorney, Agent, or Firm*—Wenderoth, Lind & Ponack L.L.P.

[57] ABSTRACT

Buried $N^+$ layers are formed in the surface of a substrate, on which first and second epitaxial layers are successively deposited. A vertical PNP transistor formed in the surface of the first epitaxial layer has a buried collector layer, a collector lead region, and a base contact region. The buried collector layer, the collector lead region, and the base contact region provide a buried anode layer, an anode lead region, and a cathode contact region, respectively, of a diode. The vertical PNP transistor and the diode are surrounded by $N^+$ lead regions and the buried $N^+$ layers.

5 Claims, 6 Drawing Sheets

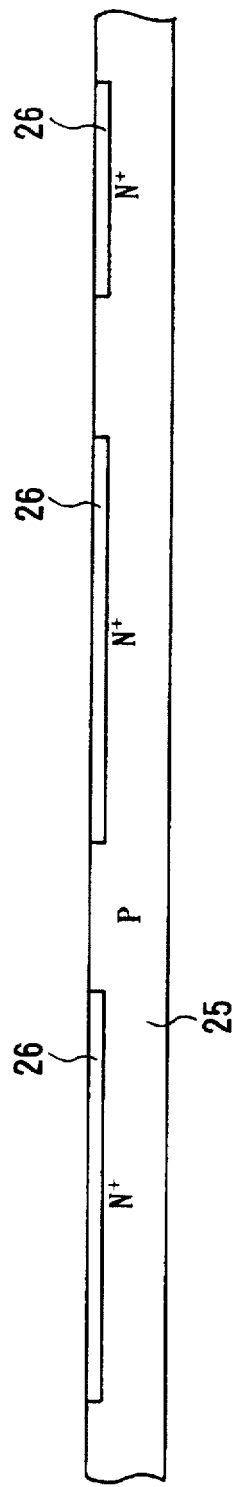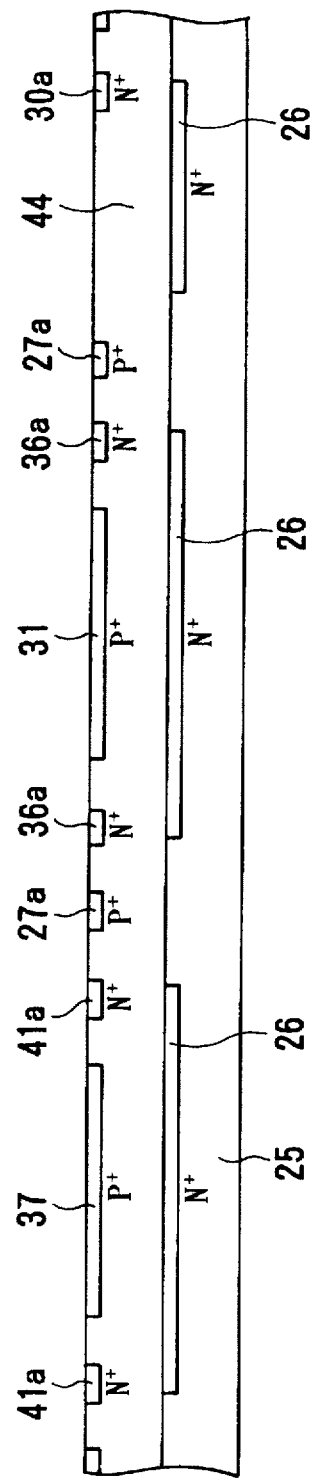

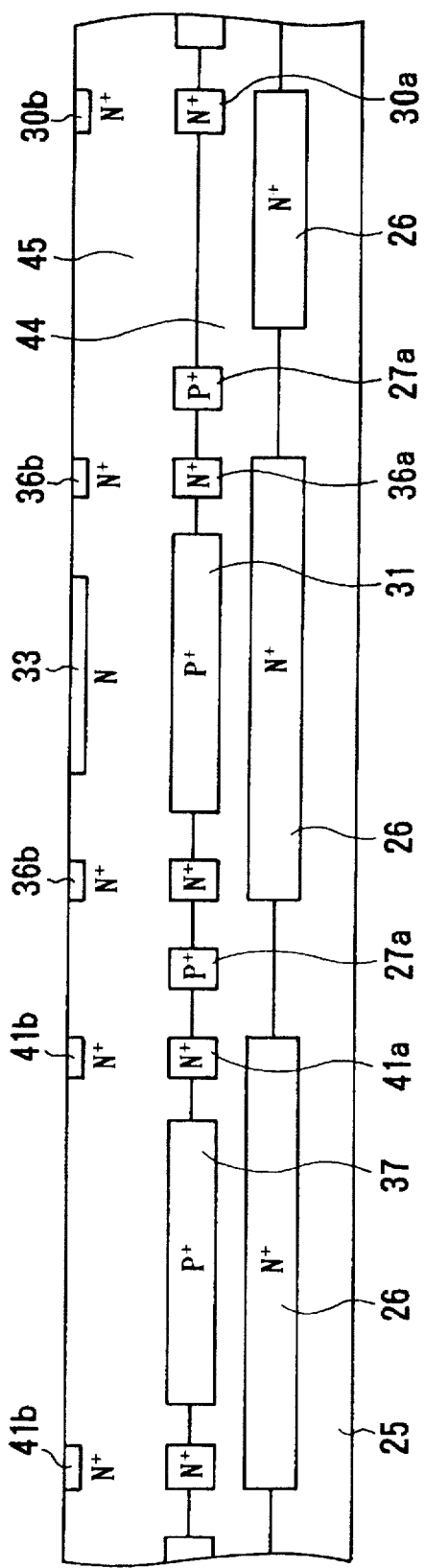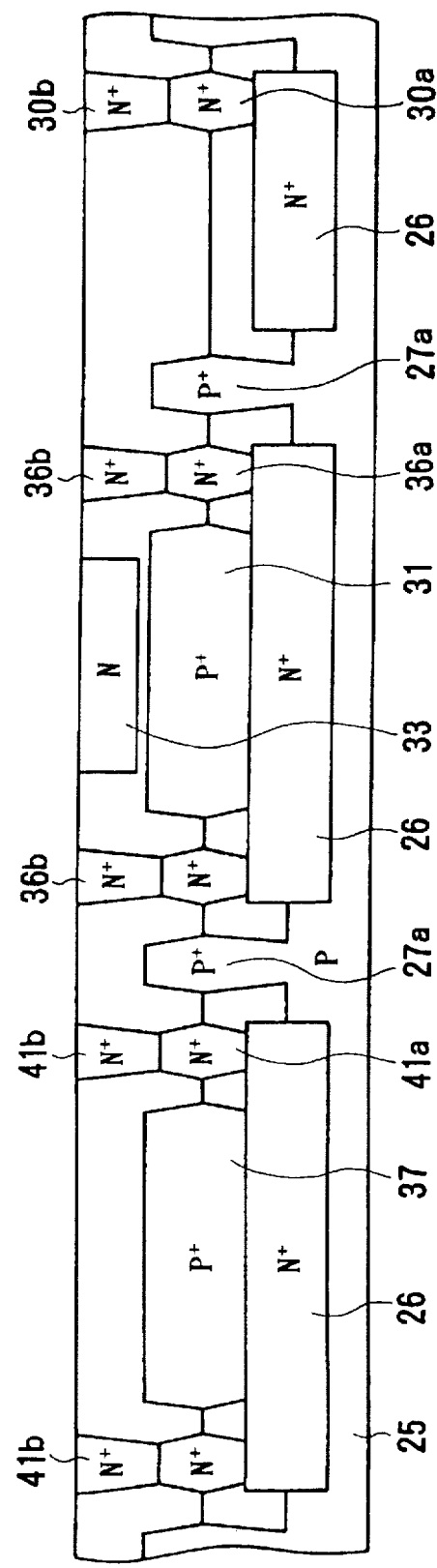

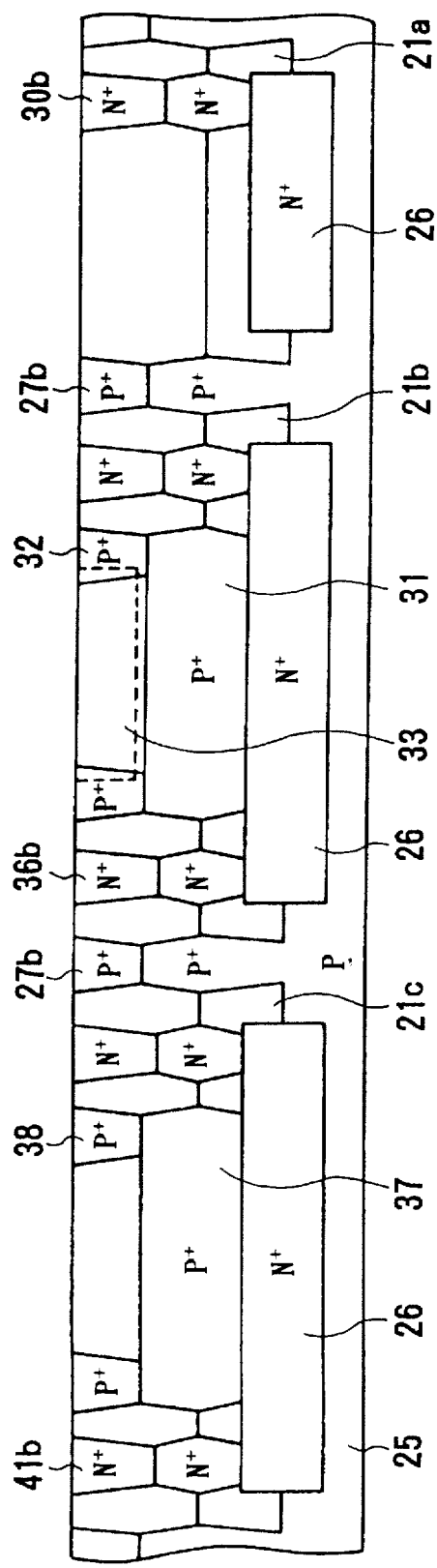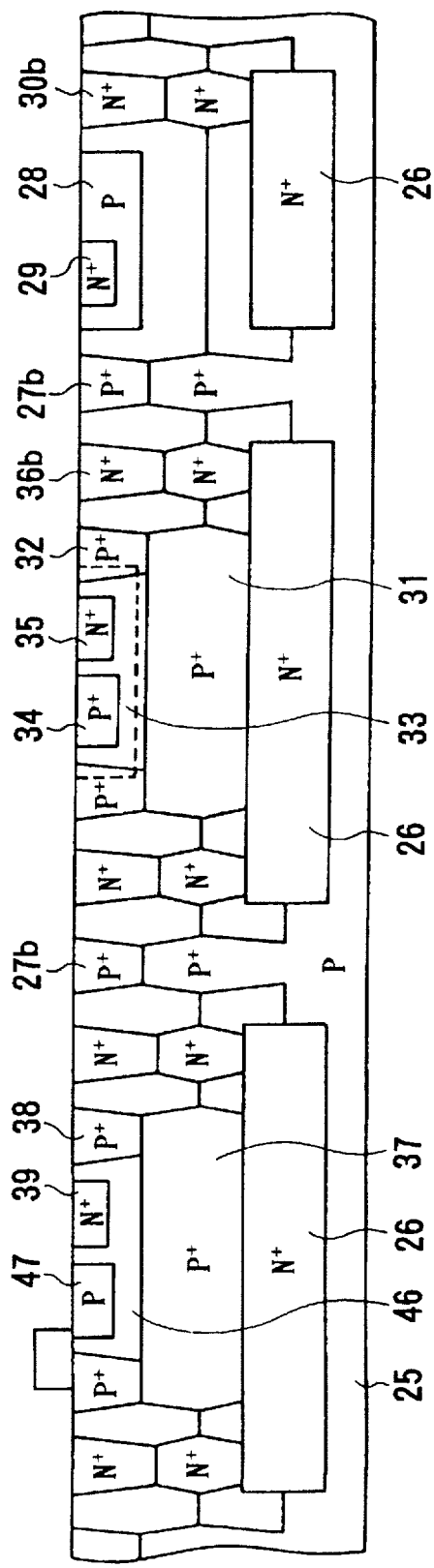

5,798,560

1

SEMICONDUCTOR INTEGRATED CIRCUIT HAVING A SPARK KILLER DIODE

BACKGROUND OF THE INVENTION

1. Field of the Invention

The present invention relates to a semiconductor integrated circuit having a spark killer diode for protecting an output transistor in a bipolar integrated circuit, and a method of manufacturing such a semiconductor integrated circuit.

2. Description of the Prior Art

There is available a bipolar integrated circuit for use as a 2- or 3-phase motor driver which finds many applications in the art. FIG. 1 of the accompanying drawings shows a one-phase section of such a bipolar integrated circuit. As shown in FIG. 1, two NPN transistors 1, 2 have an emitter and a collector, respectively, that are connected to each other at a junction from which an output terminal 3 extends. When one of the transistors 1, 2 is turned on and the other turned off, a current flows to the output terminal 3 to rotate a motor (not shown) connected to the output terminal 3 in one direction or the other.

If the load connected to the output terminal 3 is an inductive load such as a motor, then it generates a normal electromotive force in one direction or a counterelectromotive force in the other direction when the motor is energized or de-energized. Heretofore, a diode 4 is connected between the collector and emitter of the output transistor 2 which is fabricated as an IC component. When the potential at the output terminal 3 becomes lower than a GND potential or higher than a Vcc potential due to the counterelectromotive force, the diode 4 is turned on, allowing the counterelectromotive force to be drained to the fixed potential for thereby protecting the output transistor 2 and other IC components. If the bipolar integrated circuit is designed such that a large current of several amperes flows through the diode 4, then the diode 4 comprises a Schottky barrier diode as a discrete device.

From a user's viewpoint, there is a demand for fabricating the diode 4 as an IC component for the purpose of reducing the number of parts used.

For fabricating a diode in a bipolar IC, it is the customary practice to utilize a PN junction for fabricating an NPN transistor as disclosed in Japanese patent application No. 7-14302, for example. FIG. 2 of the accompanying drawings shows one such conventional bipolar IC arrangement. As shown in FIG. 2, an NPN transistor 5 has a collector comprising a separated island region 3 formed as an N-type epitaxial layer on a P substrate 6, a P-type base region 8 and an N⁺ emitter region 9 which are formed on the surface of the island region 3. The bipolar IC also includes an N⁺ collector contact region 10, an N⁺ buried layer 11, and a P⁺ separating region 12. A diode 13 is comprised to utilize a base-to-collector junction of an NPN transistor 5. Specifically, the island region 7 serves as the cathode of the diode 13, and a region formed by diffusing the base serves as an anode 14 of the diode 13. The emitter region 9 of the NPN transistor 5 is not utilized to serve as the diode 13.

Another diode configuration may comprise an emitter-to-base junction of the NPN transistor 5 or a PN junction between the island region 7 and the substrate 6. The former diode arrangement has a breakdown voltage of only several volts and hence is not suitable for use as a protection circuit of the before-mentioned motor driver. The latter diode device has its anode potential fixed to the ground potential and is not preferable from the standpoint of preventing a

2 parasitic effect because a large current flows through the substrate 6 when the diode is turned on.

The known diode structure shown in FIG. 2 can maintain a current capacity of several amperes if the area of the junction between the anode region 14 and the island region 7 is increased. However, the presence of a leakage current from the island region 7 to the substrate 6 is not negligible. For example, when a current of 1 A flows through the diode 13, the leakage current flowing from the island region 7 to the substrate 6 amounts to several tens mA. This leakage current raises the potential of the substrate 6, tending to energize other devices to operate erroneously, or causing latch-up at worst to thereby to destroy the IC.

SUMMARY OF THE INVENTION

It is therefore an object of the present invention to provide a semiconductor integrated circuit having a diode capable of handling a large current with a relatively small leakage current flowing to a substrate, which utilizes a two-stage epitaxial structure having a vertical PNP transistor of a small saturated voltage, the transistor and the diode being integrated efficiently in a small space.

Another object of the present invention is to provide a method of manufacturing a semiconductor integrated circuit.

According to the present invention, there is provided a semiconductor integrated circuit comprising a semiconductor substrate of one conductivity type, first and second epitaxial layers of an opposite conductivity type disposed on the semiconductor substrate, a plurality of buried layers of the opposite conductivity type disposed between the semiconductor substrate and the first epitaxial layer, first, second, and third island regions formed by separating the first and second epitaxial layers in surrounding relation to the buried layers, respectively, a base region of the one conductivity type disposed in the first island region, an emitter region of the opposite conductivity type disposed in a surface of the base region, a low-resistance collector region extending from a surface of the first island region to one of the buried layers, a buried collector layer of the one conductivity type disposed between the first and second epitaxial layers in the second island region in contact with another one of the buried layers, a collector lead region of the one conductivity type extending from a surface of the second island region to the buried collector layer, a base region of the opposite conductivity type surrounded by the collector lead region, an emitter region of the one conductivity type disposed in a surface of the base region of the opposite conductivity type, a buried anode layer of the one conductivity type disposed between the first and second epitaxial layers in the third island region in contact with still another one of the buried layers, an anode lead region of the one conductivity type extending from a surface of the third island region to the buried anode layer, a cathode contact region of the opposite conductivity type disposed in a surface of a region of the opposite conductivity type which is surrounded by the anode lead region, and a lead region of the opposite conductivity type extending from a surface of the second epitaxial layer to still another one of the buried layers in surrounding relation to the buried anode layer.

According to the present invention, there is also provided a method of manufacturing a semiconductor integrated circuit, comprising the steps of forming, in a surface of a semiconductor substrate of one conductivity type, a plurality of buried layers of an opposite conductivity type, forming a first epitaxial layer of the opposite conductivity type on the semiconductor substrate, forming a buried collector layer of the one conductivity type of a transistor of a conductivity type, and a buried anode layer of a diode, in a surface of the first epitaxial layer, forming a second epitaxial layer of the opposite conductivity type on the first epitaxial layer, forming a low-resistance collector region of the opposite conductivity type of a transistor of another conductivity type, and a lead region of the opposite conductivity type of the diode, in a surface of the second epitaxial layer, separating the first and second epitaxial layers into at least first, second, and third island regions, forming a base region of the one conductivity type and an emitter region of the opposite conductivity type in the first island region, to thereby form the transistor of the other conductivity type with the first island region serving as a collector thereof, forming an emitter region of the one conductivity type in a region surrounded by a collector lead region in the second island region, to thereby form the transistor of the conductivity type with the region surrounded by the collector lead region serving as a base, and forming a cathode contact region of the opposite conductivity type in a region of the opposite conductivity type surrounded by an anode lead region in the third island region, to thereby form a diode with the region surrounded by the anode lead region serving as a cathode.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 5A through 5F are enlarged fragmentary cross-sectional views illustrative of a method of manufacturing the bipolar semiconductor integrated circuit according to the present invention.

DETAILED DESCRIPTION OF THE PREFERRED EMBODIMENT

Figure 3:
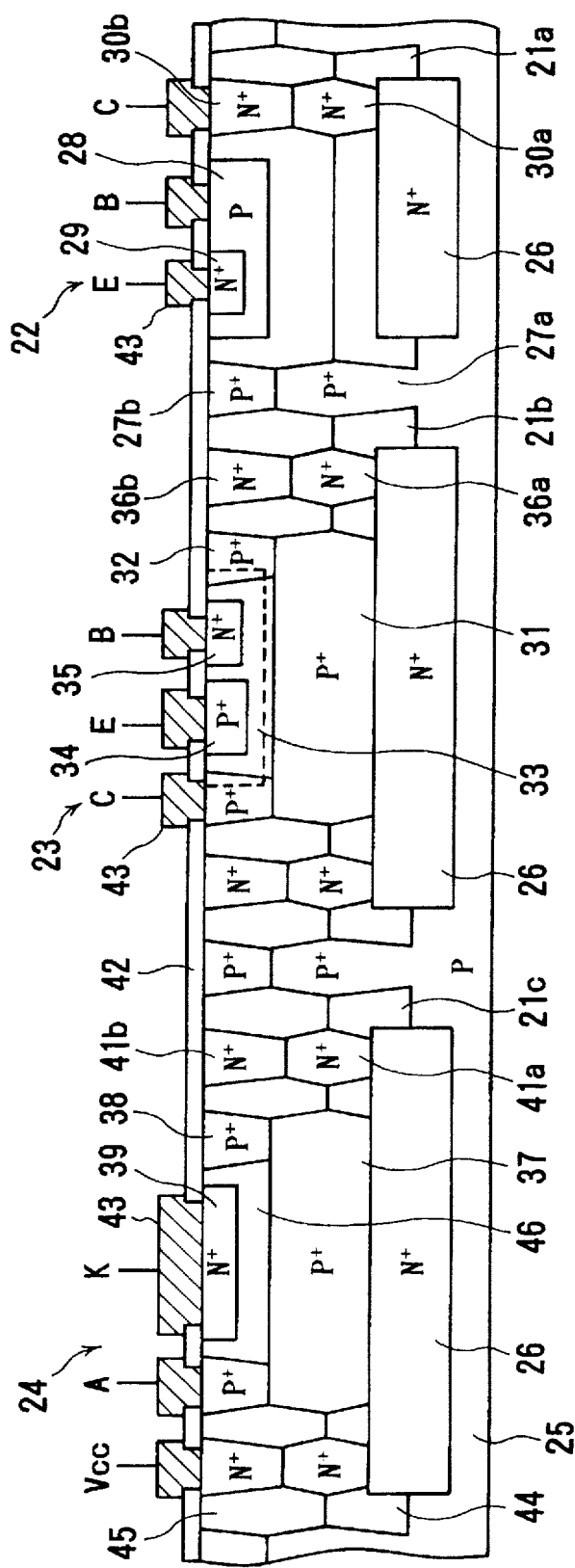
FIG. 3 is a cross-sectional view of a bipolar semiconductor integrated circuit according to the present invention.

As shown in FIG. 3, a bipolar semiconductor integrated circuit according to the present invention comprises an NPN transistor 22, a vertical PNP transistor 23, and a diode 24 which are integrated respectively in first, second, and third island regions 21a, 21b, 21c in a P-type silicon substrate 25.

The bipolar semiconductor integrated circuit also has buried $N^+$ layers 26 and $P^+$ separating regions 27a, 27b which are disposed on the P-type silicon substrate 25.

The NPN transistor 22 has a P-type base region 28, an $N^+$ emitter region 29, and low-resistance $N^+$ collector regions 30a, 30b. The vertical PNP transistor 23 has a buried $P^+$ collector layer 31, a $P^+$ collector lead region 32, an N-type well region 33, a $P^+$ emitter region 34, an $N^+$ base contact region 35, and $N^+$ lead regions 36a, 36b. The diode 24 has a buried $P^+$ anode layer 37, a $P^+$ anode lead region 38, an N-type cathode region 46, an $N^+$ cathode contact region 39, and $N^+$ lead regions 41a, 41b.

The bipolar semiconductor integrated circuit further includes an oxide film 42 and aluminum electrodes 43 held in contact with various diffused regions through contact holes defined in the oxide film 42, and first and second N-type epitaxial layers 44, 45.

The first, second, and third island regions 21a, 21b, 21c are formed by separating the first and second N-type epitaxial layers 44, 45 with the $P^+$ separating regions 27a, 27b. The low-resistance $N^+$ collector regions 30a, 30b of the NPN transistor 22 extend from a surface of the first island region 21a to the $N^+$ buried layer 26, and serve to reduce the collector series resistance of the NPN transistor 22. The NPN transistor 22 has a high breakdown voltage and is capable of handling a large current, and hence is suitable for use as a 2-or 3-phase motor driver.

In the vertical PNP transistor 23, the buried $P^+$ collector layer 31 which is buried between the first and second N-type epitaxial layers 44, 45 and extends to the $N^+$ buried layer 26 serves as a collector, and the N-type well region 33 which is surrounded by the collector lead region 32 that extends to the buried $P^+$ collector layer 31 serves as a base. In the illustrated embodiment, the N-type well region 33 is designed to increase the hfe (a parameter of amplification factor) due to field acceleration, increase the ft (cut off frequency) due to a reduction in the base width, and increase the breakdown voltage (Vceo). The $N^+$ lead regions 36a, 36b are disposed around the $P^+$ collector lead region 32, and a power supply voltage Vcc or the potential of the emitter region 34 is applied through an electrode (not shown) to the $N^+$ lead regions 36a, 36b for suppressing the generation of a parasitic PNP transistor which would be made up of the collector lead region 32 as an emitter, the island region 21b as a base, and the separating regions 27a, 27b as a collector. The vertical PNP transistor 23 thus arranged serves as a high-power PNP transistor complementary to the high-power NPN transistor 22.

The diode 24 is of basically the same structure as the vertical PNP transistor 23. Specifically, the diode 24 is a PN junction diode having an anode provided by the buried $P^+$ anode layer 37 which is buried between the first and second N-type epitaxial layers 44, 45 and extends to the $N^+$ buried layer 26, and a cathode provided by the N-type region 46 which is surrounded by the $P^+$ anode lead region 38 that extends from the surface of the island region 21c to the buried anode layer 37.

Alternatively, a P-type anode region (not shown) may be formed in the N-type region 46 surrounded by the anode lead region 38, and short-circuited to the anode lead region 38 by an electrode, increasing the area of the PN junction. Such a diode may be produced by providing a short circuit between the emitter and collector of a PNP transistor. However, the N-type well region 33 is not formed in the surrounded N-type region 46 for preventing an increase in a reverse leakage current across the PN junction which comprises a high-concentration junction.

As with the vertical PNP transistor 23, the $N^+$ lead regions 41a, 41b are provided which extend from the surface of the island region 21c to the buried $N^+$ layer 26 in surrounding relation to the buried $P^+$ anode layer 37 and the anode lead region 38. A potential which is the same as, or higher than, the potential at the anode region 38, such as the power supply voltage Vcc, is applied through the aluminum electrodes 43 to the $N^+$ lead regions 41a, 41b.

Figure 1:
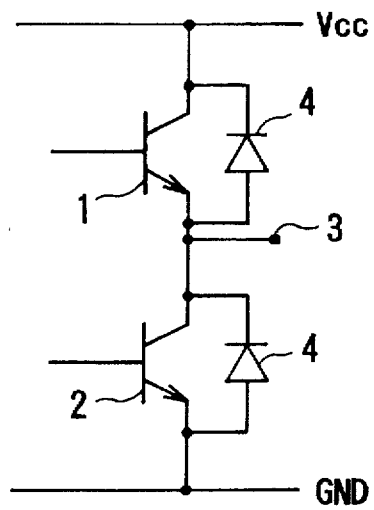
FIG. 1 is a circuit diagram of a one-phase section of a conventional driver circuit of a bipolar integrated circuit.

The NPN transistor 22 corresponds to the output transistor 1 shown in FIG. 1, and the diode 24 corresponds to the diodes 4 shown in FIG. 1. Circuit interconnections are made using the aluminum electrodes 43.

Figure 2:
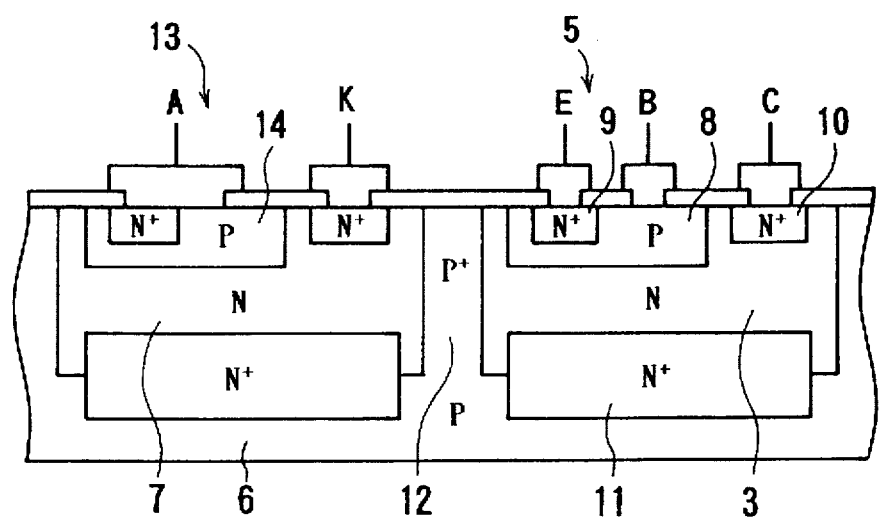
FIG. 2 is a cross-sectional view of a transistor and a diode of a conventional bipolar IC arrangement.
Figure 4B:
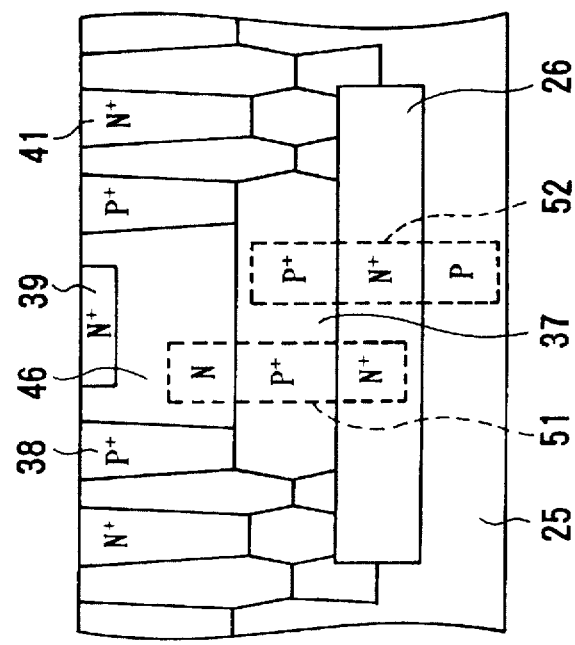
FIG. 4B is an enlarged fragmentary cross-sectional view of the bipolar semiconductor integrated circuit shown in FIG. 3.
Figure 4A:
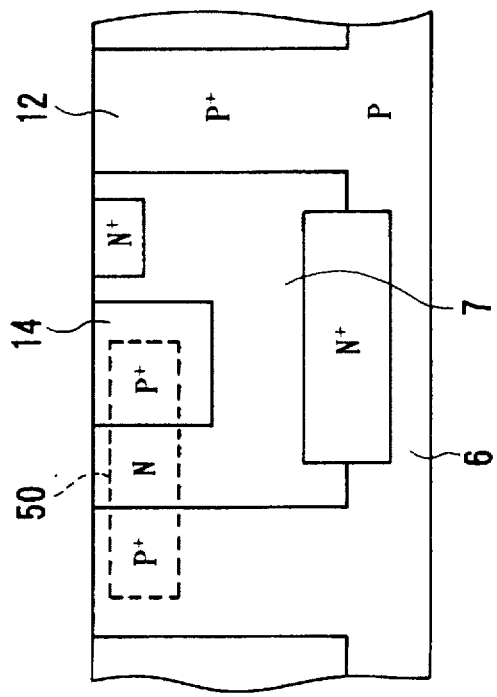
FIG. 4A is an enlarged fragmentary cross-sectional view of the conventional bipolar IC arrangement shown in FIG. 2.

An enlarged portion of the conventional diode 13 shown in FIG. 2 is illustrated in cross section in FIG. 4A, and an enlarged portion of the diode 24 shown in FIG. 3 is illustrated in cross section in FIG. 4B. In FIG. 4A, a leakage current flowing to the substrate 6 at the time an ON current flows through the diode as it is turned on depends upon the current amplification factor of a parasitic PNP transistor 50 which is made up of the anode region 14 as an emitter, the island region 7 as a base, and the separating region 12 as a collector. Since the ON current flowing through the diode means that the base-to-emitter junction of the parasitic PNP transistor 50 is turned on, the parasitic PNP transistor 50 is necessarily turned on, and it is impossible to stop the leakage current flowing to the substrate 6.

In FIG. 4B, an ON current flowing when the diode 24 is turned on, flows from the anode lead region 38 to the N-type region 46 and also from the buried $P^+$ anode layer 37 to the N-type region 46. A leakage current flowing to the substrate 25 at this time depends upon the operation of a parasitic NPN transistor 51 which is made up of the N-type region 46 as an emitter, the buried $P^+$ anode layer 37 as a base, and the buried $N^+$ layer 26 as a collector, and another parasitic PNP transistor 52 which is made up of the buried $P^+$ anode layer 37 as an emitter, the buried $N^+$ layer 26 as a base, and the substrate 25 as a collector.

According to the present invention, since the buried $N^+$ layer 26 is formed by diffusion from the surface of the substrate 25, and the buried $P^+$ anode layer 37 is formed by diffusion from the surface of the first epitaxial layer 44, a portion with a highest impurity concentration in the buried $N^+$ layer 26 is not over-spread (or covered) by the buried $P^+$ anode layer 37, and a portion with a highest impurity concentration in the buried $P^+$ anode layer 37 is not over-spread (or covered) by the buried $N^+$ layer 26. Furthermore, inasmuch as the buried $P^+$ anode layer 37 is formed by diffusion from the surface of the first epitaxial layer 44, the vertical thickness of the buried $P^+$ anode layer 37 can be increased. Therefore, the impurity concentration and the thickness (base width) of the buried $P^+$ anode layer 37, which serves as the base of the parasitic NPN transistor 51, are increased, reducing the current amplification factor of the parasitic NPN transistor 51. Because the impurity concentration of the buried $N^+$ layer 26 is increased, the current amplification factor of the parasitic PNP transistor 52 is reduced. Since a potential which is the same as or higher than the potential at the buried $P^+$ anode layer 37 is applied to the buried $N^+$ layer 26 through the lead regions 41a, 41b, the base-to-emitter junction of the parasitic PNP transistor 52 is turned off. Moreover, since the specific resistance of the buried $P^+$ anode layer 37 is small, any potential increase is small. Consequently, the parasitic PNP transistor 52 cannot easily be turned on, and its current amplification factor is small. As described above, since the current amplification factor of the parasitic NPN transistor 51 which is related to the leakage current flowing to the substrate 25 is reduced to establish a potential relationship which will not easily turn on the parasitic PNP transistor 52, and also since the current amplification factor of the parasitic PNP transistor 52 is reduced, any leakage current flowing from the diode 24 to the substrate 25 is almost eliminated.

In the vertical PNP transistor 23, if the specific resistance of the buried $P^+$ collector layer 31 is small, then the saturated voltage of the vertical PNP transistor 23 can be reduced.

FIG. 5A through 5F are illustrative of a method of manufacturing the bipolar semiconductor integrated circuit according to the present invention.

As shown in FIG. 5A, a P-type single-crystal semiconductor substrate 25 is prepared. Then, the surface of the substrate 25 is thermally oxidized to form an oxide film, which is then coated with a resist. The coated resist is exposed to light and developed into a resist pattern. Using the resist pattern as a mask, the oxide film is etched into an oxide film pattern. After the resist mask is removed, using the oxide film pattern as a mask, antimony or arsenic is initially diffused into the surface of the substrate 25, forming a plurality of buried $N^+$ layers 26.

Then, as shown in FIG. 5B, the oxide film pattern used as a mask for diffusing antimony or arsenic is removed, after which an N-type first epitaxial layer 44 is deposited to a thickness ranging from 5 to 10 µm on the entire surface of the substrate 25 by way of epitaxial growth. Then, boron is selectively initially diffused onto the surface of the first epitaxial layer 44, forming a buried $P^+$ collector layer 31, a buried $P^+$ anode layer 37, and $P^+$ separating regions 27a. Then, antimony or arsenic is selectively initially diffused onto the surface of the first epitaxial layer 44, forming a low-resistance $N^+$ collector region 30a and lead regions 36a, 41a.

Thereafter, as shown in FIG. 5C, oxide film patterns used as masks for diffusing boron and antimony or arsenic are removed, exposing the surface of the first epitaxial layer 44. Then, a second epitaxial layer 45 is deposited to a thickness ranging from 8 to 10 µm on the entire surface of the first epitaxial layer 44 by way of epitaxial growth. Then, phosphorus is selectively initially diffused onto the surface of the second epitaxial layer 45, simultaneously forming a low-resistance $N^+$ collector region 30b, $N^+$ lead regions 36b, and $N^+$ lead regions 41b.

Then, as shown in FIG. 5D, an N-type well region 33 is formed in the surface of the second epitaxial layer 45 by ion implantation. Thereafter, the entire assembly is heated at about 1100° C. for 3–4 hours for thereby thermally diffusing the N-type well region 33 and other regions.

As shown in FIG. 5E, $P^+$ separating regions 27b are formed in the surface of the second epitaxial layer 45, and the first and second epitaxial layers 44, 45 are separated into a plurality of island regions 21a, 21b, 21c. At the same time, a collector lead region 32 and an anode lead region 38 are formed in the surface of the second epitaxial layer 45. The impurity concentration of the buried $N^+$ layer 26 has its peak in the surface of the substrate 25, and impurity concentration of the buried $P^+$ anode layer 37 has its peak in the surface of the first epitaxial layer 44.

As shown in FIG. 5F, boron is diffused onto the second epitaxial layer 45, forming a P-type base region 28. Boron is also introduced into the second epitaxial layer 45 by ion implantation, forming a $P^+$ emitter region 34. Phosphorus or arsenic is diffused onto the second epitaxial layer 45, forming an $N^+$ cathode contact region 39, an $N^+$ base contact region 35, and an $N^+$ emitter region 29. At the same time that the emitter of the vertical PNP transistor 23 is formed, an anode region 47 may be formed in the surface of an N-type layer 46 of the diode and short-circuited to the anode lead region 38.

Thereafter, aluminum electrodes (not shown) are formed as circuit interconnections for establishing a circuit network of the integrated circuit.

Since the steps of fabricating the vertical PNP transistor 23 are utilized to form the diode 24, the diode 24 can efficiently be incorporated into the bipolar semiconductor integrated circuit.

As described above, because the current amplification factors of the parasitic transistors 51, 52 are greatly reduced by the two-stage epitaxial structure, the diode 24 which has a greatly reduced leakage current flowing to the substrate can be incorporated into the integrated circuit. The reduction in the leakage current is effective to prevent the integrated circuit from malfunctioning and suffering latch-up. Therefore, a spark killer diode for an output transistor can be integrated in an integrated circuit, allowing an electronic device with such an integrated circuit to be reduced in size and increased in packing density. Inasmuch as the structure of the vertical PNP transistor 23 can be utilized, the diode can be integrated through a simple fabrication process. The vertical PNP transistor 23 has its saturated voltage reduced through the collector resistance.

Although a certain preferred embodiment of the present invention has been shown and described in detail, it should be understood that various changes and modifications may be made therein without departing from the scope of the appended claims.

What is claimed is:

1. A semiconductor integrated circuit having a spark-killer diode, said spark-killer diode comprising:

a semiconductor substrate of a first conductivity type;

first and second epitaxial layers disposed on said semiconductor substrate and being of a second conductivity type opposite said first conductivity type;

a first buried layer of said second conductivity type disposed between said semiconductor substrate and said first epitaxial layer, said first buried layer having a peak of an impurity concentration thereof at a surface between said semiconductor substrate and said first epitaxial layer;

a second buried layer of said first conductivity type disposed between said first epitaxial layer and said second epitaxial layer, said second buried layer having a peak of an impurity concentration thereof at a surface between said first epitaxial layer and said second epitaxial layer;

a first lead region of said second conductivity type extending from a surface of said second epitaxial layer to said first buried layer, and a second lead region of said first conductivity type extending from a surface of said second epitaxial layer to said second buried layer; and a cathode layer of said second conductivity type disposed on said second buried layer, said cathode layer being surrounded by said second lead region in said second epitaxial layer, said second buried layer and said second lead region being an anode region.

2. A semiconductor integrated circuit according to claim 1, further comprising a cathode contact region of said second conductivity type disposed in a surface of said cathode region.

3. A semiconductor integrated circuit according to claim 1, wherein said first conductivity type is a P type, and said second conductivity type is an N type.

4. A semiconductor integrated circuit comprising:

a P type semiconductor substrate;

first and second N type epitaxial layers disposed on said semiconductor substrate;

a first $N^+$ type buried layer disposed between said semiconductor substrate and said first epitaxial layer, said first buried layers having a peak of an impurity concentration thereof at a surface between said semiconductor substrate and said first epitaxial layer;

a second $P^+$ type buried layer disposed between said first epitaxial layer and said second epitaxial layer, said second buried layers having a peak of an impurity concentration thereof at a surface between said first epitaxial layer and said second epitaxial layer;

a first $N^+$ type lead region extending from a surface of said second epitaxial layer to said first buried layer, and a second $P^+$ type lead region extending from a surface of said second epitaxial layer to said second buried layer;

a base region of a vertical PNP transistor disposed in said second epitaxial layer;

an emitter region of said vertical PNP transistor disposed in a surface of said base region;

a collector region of said vertical PNP transistor disposed under said base region, said collector region comprising said second buried layer which is connected to said second lead region extending to a surface of said second epitaxial layer, said second buried layer and said second lead region being surrounded by said first buried layer and said first lead region;

an N type cathode region disposed on said second buried layer, said cathode region being surrounded by said second lead region in said second epitaxial layer, said second buried layer and said second lead region being an anode region.

5. A semiconductor integrated circuit according to claim 4, further comprising an $N^+$ type cathode contact region and an $N^+$ type base contact region respectively disposed in surfaces of said cathode region and said base region.

* * * * *